United States Patent [19]

Hopwood et al.

[11] 4,096,445
[45] Jun. 20, 1978

[54] ELECTROMECHANICAL VIBRATION FILTER FOR RADAR MASTER OSCILLATORS

[75] Inventors: Francis W. Hopwood, Severna Park; John P. Muhlbaier, Joppa; Herman Rossman, Randallstown, all of Md.

[73] Assignee: Westinghouse Electric Corp., Pittsburgh, Pa.

[21] Appl. No.: 789,487

[22] Filed: Apr. 21, 1977

[51] Int. Cl.² .............................................. H03B 3/04
[52] U.S. Cl. ...................................... 331/17; 331/23; 331/25; 331/65; 331/116 R; 343/5 AF; 343/5 ST
[58] Field of Search .................. 331/17, 18, 23, 25, 331/65, 116 R, 158; 343/5 R, 5 AF, 5 ST

[56] References Cited

U.S. PATENT DOCUMENTS

| 3,606,233 | 9/1971 | Scharton et al. | 248/358 R |
| 3,807,678 | 4/1974 | Karnopp et al. | 248/358 R |
| 3,931,585 | 1/1976 | Barker et al. | 331/1 A |

Primary Examiner—Siegfried H. Grimm
Attorney, Agent, or Firm—H. W. Patterson

[57] ABSTRACT

A vibration noise filtering system for use in airborne radar master oscillator, RMO, systems is disclosed. Master and slave crystal oscillators are used, the slave oscillator being phase locked to the master oscillator governed by a phase locked loop, PLL, having a predetermined low frequency bandwidth. The master oscillator is structurally coupled directly to a source of vibration of the aircraft, while the slave oscillator is isolated and supported from the vibration source by a mechanical passive isolator having a resonant frequency well within the low frequency bandwidth of the PLL. The output of the slave oscillator which is the source of the RMO signal has a phase spectral density within the phase stability requirements of a typical RMO across the operating modulating frequency ranges of both air-to-ground and air-to-air radar modes.

9 Claims, 12 Drawing Figures

ELECTROMECHANICAL VIBRATION FILTER FOR RADAR MASTER OSCILLATORS

GOVERNMENT CONTRACT

The invention herein described was made in the course of or under a contract or subcontract with the Department of the Air Force.

BACKGROUND OF THE INVENTION

1. Field of the Invention

This invention relates to a vibration noise filtering system for use in airborne radar systems and more particularly to a system comprised of both a passive mechanical isolator and an electronic active circuit for filtering vibration induced noise in the radar master oscillator signal over a wide frequency spectrum.

2. Description of the Prior Art

Recently, there has been a trend towards employing multi-mode radar systems in today's aircraft utilizing both coherent air-to-ground (mapping) and coherent air-to-air operation modes. Mechanically sensitive quartz crystals are primarily used as the source of the transmittal carrier signal and the receiver mixing signal for most radar master oscillator, RMO, systems. Generally, signal content modulation frequencies of air-to-ground mode operation are in the range from 0.01 Hz to 100 Hz and for air-to-air modes from 100 Hz to approximately 2 MHz. A problem of paramount importance to airborne radar systems is the large vibrations generated within the aircraft as a result of the constant maneuvering thereof. These vibrations are effected across the frequency spectrum and may induce a frequency response in the quartz crystal of the RMO within the modulation frequency spectrum of the received signal content which ultimately may appear as part of the radar image producing false indications or incorrect information, as the case may be.

In the case in which both air-to-ground and air-to-air modes are utilized in an aircraft, the RMO crystal must have both excellent low frequency and high frequency phase stability, respectively. The phase spectral stability requirements of an RMO are normally measured by the quantity referred to as phase spectral density which is a measurement, usually in decibels, of the power in the noise sidebands per unit bandwidth with respect to the total radio frequency power per unit bandwidth. Typical phase stability requirements starting at approximately $-35$ dB at 2 Hz, decreases at $-20$ dB/decade to about $-80$ dB at around 200 Hz. Thereafter, the requirement changes abruptly reaching a plateau value of approximately $-120$ to $-140$ dB at around 2000 Hz. One may operate on the phase spectral stability requirement of the RMO using a given mathematical relationship to yield a representative envelope of permissible vibration input. This representation is generally compared with the vibration spectrum which is representative of that which is expected to occur in the particular aircraft in question under worst case conditions. In an exemplary case, the expected frequency vibration envelope may exceed the representative permissible vibration spectrum by 3 or 4 dB at the low frequency end at around the 20 Hz range, while the high frequency vibration input at around 2000 Hz may exceed that permissible by about 40 dB.

A classic approach to reducing or eliminating the high frequency vibration problem is to mount the enclosure of the RMO structurally on one or more stages of passive mechanical isolators which separate it from the vibration source. This approach has been successfully used in some aircraft where only air-to-air mode radar operation was facilitated. Unfortunately, this solution is generally not adequate for the aircraft which employ both air-to-air and air-to-ground airborne radar systems. The reason lies in the limitation of the conventional mechanical vibration isolators.

The vibration input to an aircraft, as a result of maneuvering thereby, normally has a fixed amplitude power spectrum over a wide bandwidth. However, the surrounding mechanical supporting structure of the aircraft creates, at times, resonance "peaking" which results in a vibration source spectrum to the RMO enclosure of both amplified narrow band and relatively lower amplitude broad band vibration noise. This same phenomenon occurs when a mechanical isolator is structurally connected between the RMO enclosure and the vibration source for inhibiting the transmissibility of vibration noise to the insulated RMO enclosure. More specifically, the conventional mechanical isolators may result in amplification factors on the order of 8 to 10 dB at their resonance frequency. For example, a 1.0g broad band spectrum vibration source input may result in a 2.5 to 3.0g amplified input to the isolated RMO enclosure in the vicinity of the resonant frequency of the isolator which is normally set at around 20 Hz for air-to-air vibration protection. This might be acceptable for individual air-to-air radar systems, but the amplification vibratory noise at around 20 Hz further complicates the air-to-ground mode radar operation which is anticipated to be 3 to 4 dB out of specification already as described above.

Attempts to solve the problem by conventional means leads to possibly increasing the number of stages of mechanical vibration isolation or lowering the isolation cut-off frequency. Either case will result in size and weight increases and possibly larger sway space requirements which are normally undesirable to aircraft designers. Attractive solutions of unconventional means have been suggested to include an active isolator, either in cascade or parallel with the passive isolator, both disposed between the vibration source and isolated mass for the purposes of damping the "peaking" effects of the passive isolator on the isolated mass at low frequencies. Known active systems typically have used hydraulic damping principles to counteract the movement of the isolated mass at undesirable frequencies.

The U.S. Pat. No. 3,606,233 issued to Scharton et al. on Sept. 20, 1971 and U.S. Pat. No. 3,807,678 issued to Karnopp et al. on Apr. 30, 1974 both teach a hybrid vibration isolation system comprising both a passive and an active isolator wherein the active isolator provides damping of the amplified vibrations produced by the passive isolator at the resonant frequency thereof. The active systems of Scharton et al. and Karnopp et al are basically hydraulic in operation and include a pressurized hydraulic fluid energy source, a hydraulic servo valve coupled to an hydraulically operated piston actuator for converting the hydraulic energy into a controllable form for effecting a counteraction to the undesirable movement of the isolated mass, and an electronic feedback system for monitoring the instant velocity of the isolated mass and governing the servo valve with respect to said movement.

While these active systems do cooperate effectively with the passive isolators to regulate the transmissibility characteristics of the overall system, they also have their disadvantages. In general, isolation systems of this type must be carefully designed, maintained and controlled to avoid unstable behavior. In addition, such hybrid systems require an auxiliary source of hydraulic energy and equipment to convert this energy into a convenient form for use thereby. Accordingly then, a hybrid system having an active device for complementing a mechanical passive isolation system in its resonant frequency range appears attractive for use in preventing vibration induced noise in the RMO of airborne radar employing both air-to-ground and air-to-air modes of operation. A hybrid system which could eliminate the necessity of an auxiliary energy source and conversion equipment and maintain effective vibration transmission regulatory characteristics would be preferred. One in which the active portion could be implemented in solid-state electronics would be even further preferred.

SUMMARY OF THE INVENTION

In accordance with the present invention, a vibration noise filtering system for providing a phase stable radar master oscillatory signal while affected by vibration frequency signals encompassing a wide range of frequency spectrum transmitted thereto by a vibration source is configured with two crystal oscillator sources, a passive mechanical isolator and a low frequency pass band phase lock loop, PLL, for reducing the vibration effects on the radar master oscillator, RMO, signal for use in multi-mode airborne radars.

More specifically, one crystal oscillator source is structurally coupled to the vibration source and generates a first oscillatory signal having a noise component being a function of the vibration frequency signals transmitted thereto by the vibration source. The passive mechanical isolator is structurally coupled between the other crystal oscillator source and the vibration source for reducing the transmissibility of a first range of vibration frequencies therebetween. The mechanical isolator also effects an amplification of vibratory noise signals in a second range of vibration frequencies as transmitted to the other crystal source therethrough. The PLL is responsive to the one crystal oscillator source for controlling the other crystal oscillator to generate a radar master oscillatory signal in phase with the first oscillatory signal, and wherein the PLL decreases responsiveness to the frequencies of the noise component of the first oscillatory signal which are outside the low frequency pass bandwidth of the PLL. The low frequency pass band is selected to substantially include the second range of amplified vibration noise frequencies and to effectively filter the noise component of the first oscillatory signal within a predetermined range of vibration frequencies transmitted from the vibration source.

DESCRIPTION OF THE PREFERRED EMBODIMENT

Figure 1:
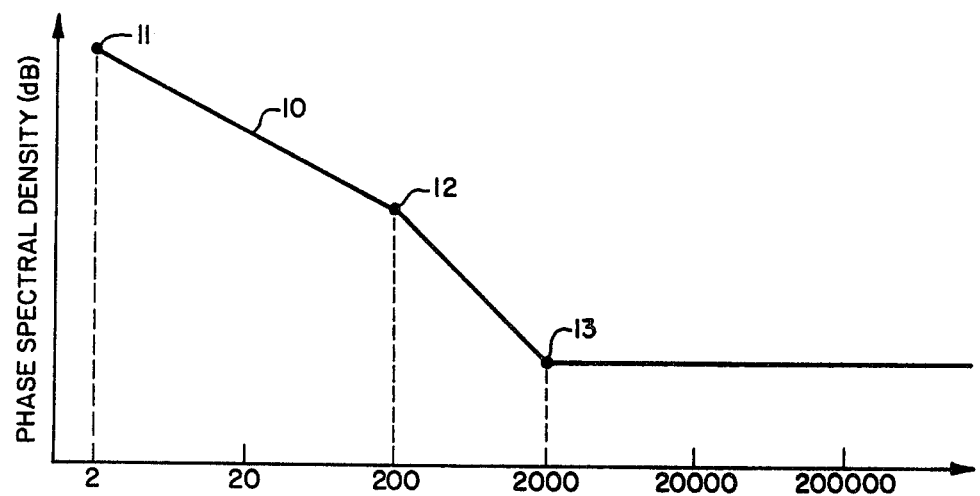
FIG. 1 is a graph depicting a typical phase stability requirement for a multi-mode radar master oscillator.

Referring to FIG. 1, a graph displaying a typical phase stability requirement for a multi-mode radar system is presented. As has been previously described in the background, the phase stability is generally measured in unit of power (decibels) designated as the phase spectral density 10. Normally, this term represents the power in the noise sidebands per unit bandwidth with respect to the total radio frequency power. Typical figures of the graphs may be −35 dB at 2 Hz, point 11, which decreased at approximately −20 dB/decade to about −80 dB at 200 Hz, point 12. An abrupt change in requirements is likely to occur between 200 and 2000 Hz resulting in a decrease of the phase spectral density 10 to around −120 or −140 dB, point 13. The density 20 will for the most part, remain fairly constant at modulation frequencies above 2000 Hz. That phase spectral density 10 between the frequencies 2 to 200 Hz relates mostly to the requirements of air-to-ground radar mode operation and that requirement greater than 2000 Hz relates, in general, to air-to-air radar mode operation. Accordingly then, a radar master oscillator must provide a signal based on these requirements or others similar thereto.

Figure 2:
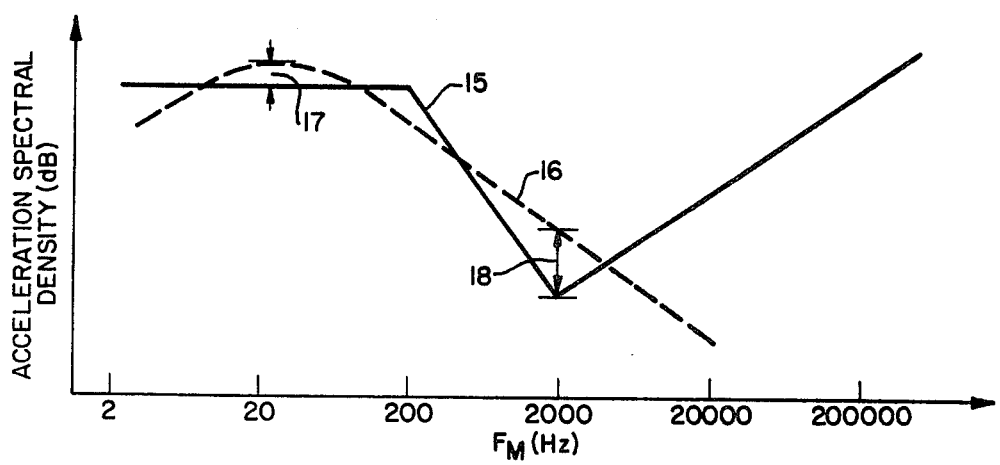
FIG. 2 is a graph depicting permissible vibration into a radar master oscillator having the requirements of FIG. 1.
Figure 3:
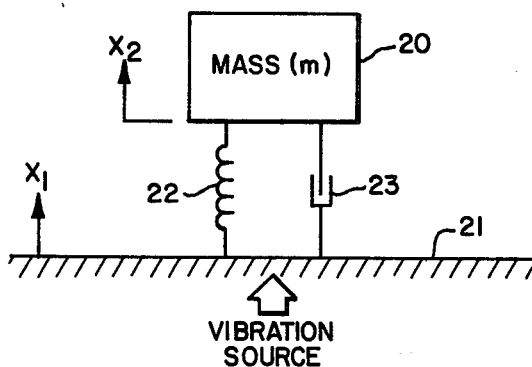
FIG. 3 is a simplified schematic of a mass being isolated from a vibration source using a passive mechanical isolator.

In FIG. 2 is a graph displaying the permissible vibration input 15. A relationship does exist between the phase noise requirement of FIG. 1 and the permissible vibration input of FIG. 2 and may be represented by the following equation (1):

$$\Delta \phi_{rms} = \frac{\Delta F_{rms}}{F_M} = \frac{1}{F_M} \left( \frac{dF}{da} \right) \cdot A_{cc_{rms}} \tag{1}$$

where $\phi_{rms}$ represents the phase spectral density of FIG. 1, $\Delta F_{rms}$ represents the frequency deviation, $F_M$ is the modulation frequency, $(dF/da)$ is the vibration sensitivity and $A_{cc_{rms}}$ represents the vibration input spectrum. This relation depicted in equation (1) may be used to operate on the requirements of FIG. 1 to provide the representative permissible vibration input of FIG. 2. In equation (1), the vibration sensitivity and acceleration spectrum are vectorial quantities, which represent the summation of various vectorial inputs. In addition to the typical permissible vibration spectrum 15 of FIG. 2, is an example of the vibration spectrum 16 which might be encountered in an aircraft environment. It is shown, in FIG. 2, that typically the low frequency induced vibration spectrum exceeds that permissible by 3 or 4 dB at around 20 Hz, region 17, while the high frequency induced vibrations normally exceed that permissible by about 40 dB at around 2000 Hz, region A classic approach for reducing this high frequency vibration induced noise into a radar master oscillator system was to mount one or more stages of passive mechanical vibration isolation between the vibration source mass as schematically depicted in FIG. 3. A system mass 20 having a mass, m, is coupled to a mounting plate 21 which is considered to be the vibration source using a spring 22 having a spring constant, k, and a dashpot 23 having a dissipative factor, r. The spring 22 and dashpot 23 comprise a mechanical isolator. The movement of mass 20 and mounting plate 21 may be represented by $X_2$ and $X_1$, respectively. This simplified mechanical system may best be described as a low-pass filter structure having a cut-off frequency $W_o$, determined by the mass, m, and spring constant, k, while an amplification factor Q, may be determined by the dissipative factor, r. The frequency response of the mechanical system of FIG. 3 may best be shown in the form of the transfer function of equation (2) below using the Laplace transformation.

$$T(s) = \frac{\ddot{X_2}}{\ddot{X_1}} = \frac{1 + S/W_o Q}{1 + S/W_o Q + (S/W_o)^2} \quad (2)$$

where $$W_o = \sqrt{k/m} \quad (3)$$

and $$Q = r/\sqrt{km} \quad (4)$$

Figure 4:
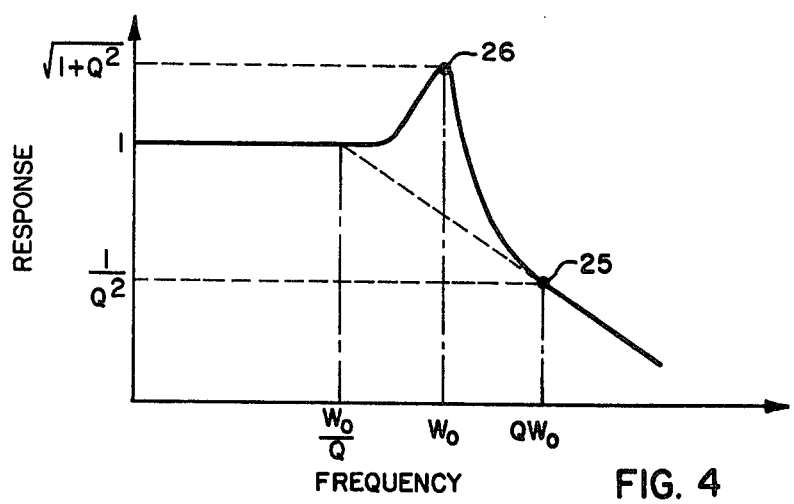
FIG. 4 is a graph illustrating the frequency response of the system of FIG. 3.

The equation (2) may be characterized by the graph of FIG. 4. It is shown therein that the high frequency response at point 25 is determined by the mass and dissipative factor, $QW_o$, as can be calculated by multiplying together equations (3) and (4), above. Also, the measure of amplification present at the resonant frequency, point 26, can be dipicted by equation (5) below:

$$\text{Amplification (in dB)} = 10 \log (1 + Q^2) \quad (5)$$

Reasonably achievable mechanical isolators of this type, other than those described in the background as using hydraulic damping of some sort, result in amplification of 8 to 10 dB at the resonant frequency. This might be acceptable, if it were not for the already existing 3 or 4 deviation from permissible vibration specification at around 20 Hz as shown in FIG. 2. Therefore, it may be concluded that any attempt to attenuate high frequency vibrations with a simple passive mechanical isolator will contribute to the low frequency vibration problem which already exceeds that permitted for air-to-ground radar mode operation.

Figure 5:
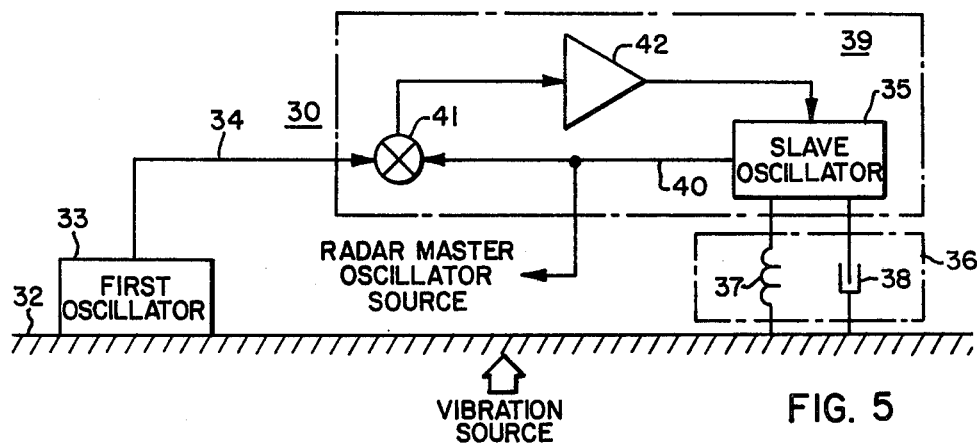
FIG. 5 is a schematic block diagram of a vibration noise filtering system.

As shown in FIG. 5, the present invention makes use of two oscillator sources, a standard vibration isolation system and a low pass band phase lock loop to provide a master radar oscillator source signal which substantially meets the requirements of FIG. 1, for the most part, while under the influence of the typical aircraft vibration noise spectrum. More specifically, FIG. 5 depicts a vibration filter system 30 coupled to a mounting surface 32, typically a rigid deck plate of an aircraft, the movement of which is considered to be the source of vibration input to the vibration input system 30. A first oscillator 33 is hard mounted to the mounting plate 32 and generates an oscillatory signal 34, typically a multiple of a carrier frequency in the range of 5 to 10 MHz. Movement of the mounting plate 32 may be transmitted substantially unchanged to the first oscillator, resulting in a component of vibration noise imposed on the oscillating signal 34 generated thereby. Another oscillator 35, which may be designated as the slave oscillator, is coupled to the mounting surface 32 using a passive mechanical isolator system 36 which may be comprised of a mechanical wire spring 37 and in parallel therewith a conventional dashpot 38 made from rubber bushings or other similar apparatus. The mechanical isolator 36 has a transfer function as shown in equation (2) above, which may be considered idealized but suitable for the purposes of this description. The isolator 36 has a resonant frequency, $W_o$, and amplification factor, Q, and may be similarly characterized by the graph of FIG. 4.

The slave oscillator 35 generates an oscillatory signal 40 which may be used as the source for producing the radar master oscillator signal for multi-mode airborne radar, as one application. The slave oscillator 35 is part of a phase lock loop 39 which further comprises a conventional doubly-balanced frequency mixer 41 and a loop amplifier 42. The phase lock loop 39 controls the output signal 40 of the slave oscillator 35 to be phase locked to the first oscillatory output signal 34 being frequency response limited to modulation frequencies within an appropriately chosen low pass bandwidth. A degraded frequency response is effected by the low pass bandwidth of loop 39 to filter the high modulation frequency vibration noise component of oscillatory signal 34 to prevent tracking of the oscillatory signal 40 thereto. The oscillatory signal 40 may therefore by only phase locked to the oscillatory signal 34 and vibration frequency noise components thereof which are within the low frequency passband of the loop 39.

Figure 6:
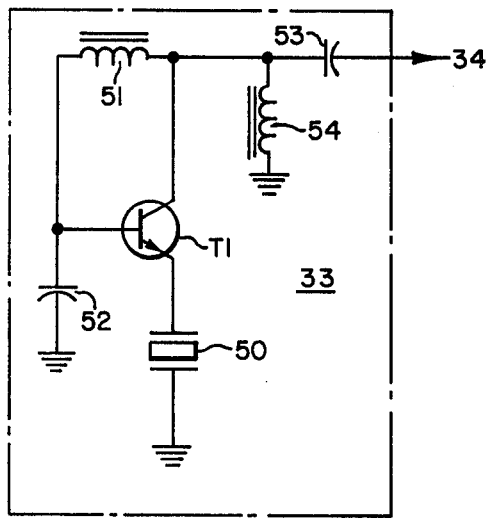
FIG. 6 is an electronic schematic of a non-tunable quartz crystal oscillator suitable for use in the system of FIG. 5.

A typical oscillator circuit 33 may best be described in connection with FIG. 6. FIG. 6 schematically represents an AC model without bias circuitry of a quartz crystal oscillator. A quartz crystal 50 which may have a frequency within the range of 5 to 10 MHz is connected from the emitter of a transistor T1 to ground and forms a series resonance therebetween. A circuit for compensating the oscillator within the desired crystal harmonic comprises of an inductor 51, typically ferrite core, connected between the base and collector of T1 and a capacitor 52 connected between the base and ground of transistor T1. The useful output 34 of the oscillator 33 is AC coupled using capacitor 53. An inductor 54 is additionally tied between the collector of T1 and ground to form an impedance transformer suitable for the purposes of the oscillator 33. A conventional frequency multiplication circuit (not shown) may be cascaded with the input 34 for the purposes of matching the carrier frequency of the output signal 34 with the frequency of the slave oscillator 35.

Figure 7:
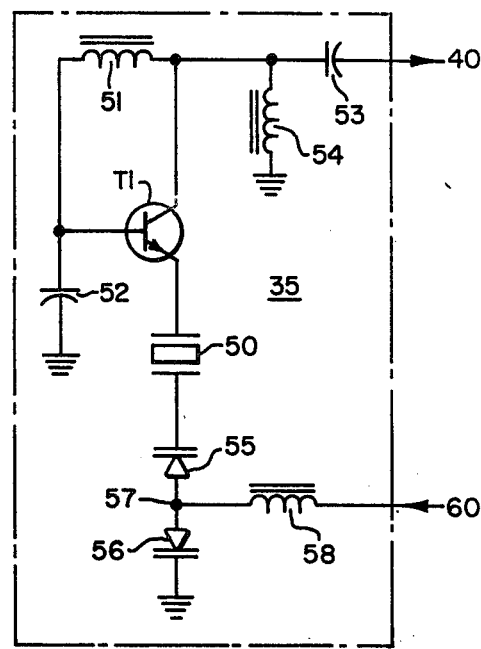
FIG. 7 is an electronic schematic of a tunable quartz crystal oscillator suitable for use in the system of FIG. 5.

The slave oscillator circuit 35 may be controlled by changing the series resonance of the quartz crystal 50 disposed between the emitter of T1 and ground as shown in the circuit of FIG. 6. One possible method of producing this effect, as shown in FIG. 7, is with the addition of two varactor tuning diodes 55 and 56 inserted in series between the quartz crystal 50 and ground having their anodes connected together to form a junction 57. One end of a typical ferrite core inductor 58 is connected to the junction 57, normally referred to as the tuning port and an input voltage signal 60 may be imposed at the other end of the inductor for the purposes of controlling the frequency of the useful output 40 of the slave oscillator 35. It is understood that the circuits of FIGS. 6 and 7 are provided herein to describe the operation of a typical crystal oscillator and are somewhat simplified for those purposes. Other more sophisticated crystal oscillators may be used to achieve improvements of the vibration noise filtering function described in connection with FIG. 5.

Figure 8:
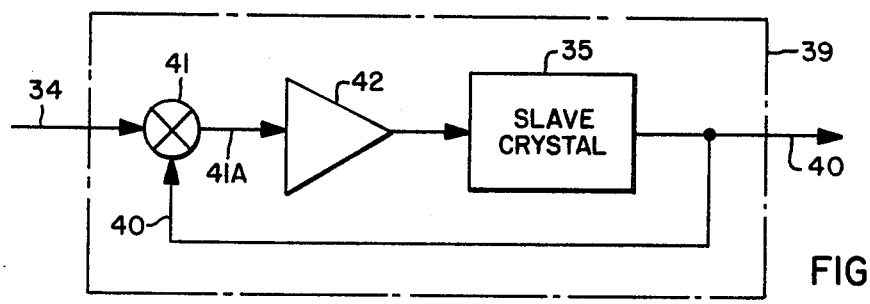
FIG. 8 is a functional block schematic of a phase lock loop suitable for use in the system of FIG. 5.

The phase lock loop 39 of FIG. 5 is shown functionally in a more suitable schematic in FIG. 8. The doubly-balanced mixer 41 generates a difference frequency, or "beat" frequency, signal 41A at times when oscillatory signal 40 is not in phase with oscillatory signal 34. The amplifier 42 has an open loop gain characteristic as a function of frequency similar to that of the solid line 70 shown in FIG. 9. At frequencies less than that designated as $f_1$, the amplifier gain increases at 20 dB/decade towards a DC state. From frequency $f_1$ to a frequency designated as $f_3$, the gain may remain constant at 0 dB and thereafter drop off at approximately $-20$ dB/decade. Since the signal 41A is representative of the phase between the oscillatory signals 34 and 40, the operation performed by that of slave oscillator 35 must be that of an integration characteristic represented by the dotted line 71 shown in FIG. 9. A cross-over frequency of $f_2$ is selected between $f_1$ and $f_3$ for the purposes of this embodiment. Since the amplifier 42 and slave oscillator 35 are cascaded these characteristics may be added to form an open loop gain composite characteristic indicated by the dash-dot line 72 of FIG. 9.

Figure 9:
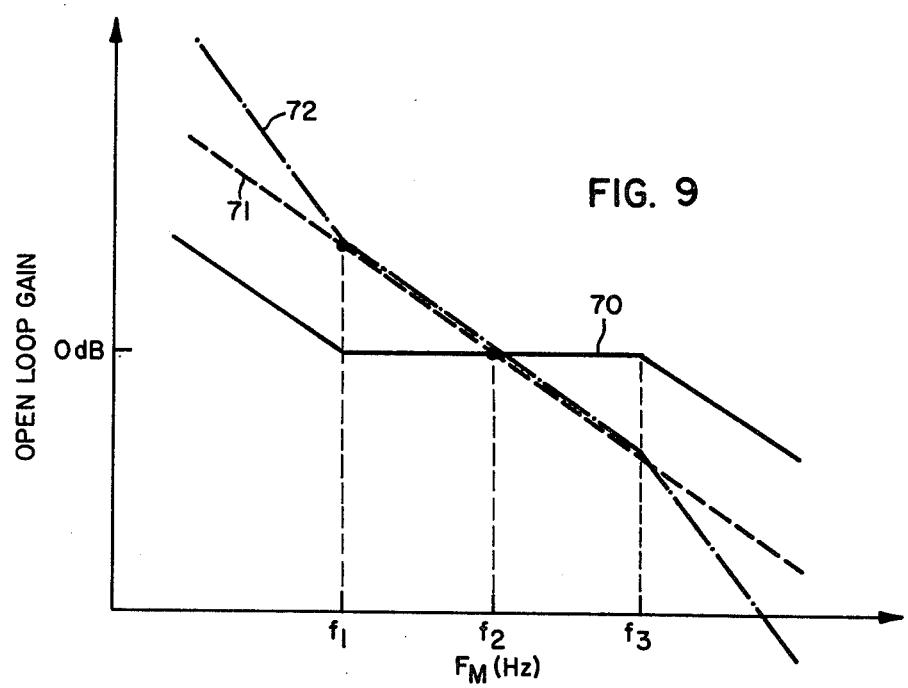
FIG. 9 comprises graphs of frequency response characteristics representing the operation of the elements of the phase lock loop of FIG. 8.

The phase lock loop 39 may be analyzed as a linear system by considering the open loop composite gain characteristics of FIG. 9 as the forward loop gain, G, and consider the feedback loop gain H at unity. Using the typical closed-loop Laplace transfer function equation shown below in equation (6), the closed-loop relationship of the loop 39 can be represented by Laplace terms in equation (7) and in better form in equation (8).

$$T(s) = \frac{G}{1 + G \cdot H} \quad (6)$$

$$T(s) = \frac{\frac{(1 + st_1)}{s^2 t_1 t_2 (1 + st_3)}}{1 + \left[\frac{(1 + st_1)}{s^2 t_1 t_2 (1 + st_3)}\right]} \quad (7)$$

$$T(s) = \frac{(1 + st_1)}{(s^3 t_1 t_2 t_3 + s^2 t_1 t_2 + st_1 + 1)} \quad (8)$$

where $t_1 = 1/f_1$ and $t_2 = 1/f_2$ and $t_3 + 1/f_3$.

The closed loop gain represented by the Laplace transfer equation (8) may be shown in a better light by assuming that $t_1 \gg t_2 \gg t_3$ which in reality is a practical selection as will be shown in the selected values below. In this case, the product of the terms $[(1+st_1)(1+st_2)(1+st_3)]$ is equal to the term $1+s(t_1+t_2+t_3)+s^2[(t_1t_2)+t_3(t_1+t_2)]+s^3t_1t_2t_3$. This term may be approximated by the polynominal $1+st_1+s^2t_1t_2+s^3t_1t_2t_3$ which is equal to the denominator of equation (8). If the denominator of equation (8) is replaced with terms $[(1+st_1)(1+st_2)(1+st_3)]$, an approximation of the closed loop transfer function of equation (8) will appear containing two poles as shown in equation (9) below wherein the poles have resonant frequencies of $f_2$ and $f_3$.

$$T(s) = \frac{1}{(1 + st_2)(1 + st_3)} \quad (9)$$

Figure 10:
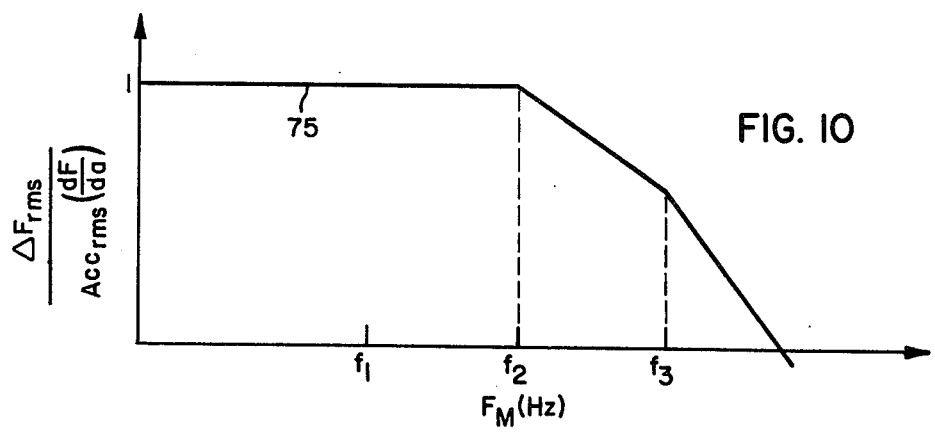
FIG. 10 depicts graphically an approximation of the closed-loop transfer function of the phase lock loop of FIG. 8.

Equation (9) may be depicted graphically in FIG. 10 to illustrate the frequency response characteristics of the phase lock loop 39. The effects of decreasing responsiveness to the modulation frequencies of the vibration noise component of signal 34 outside the low pass bandwidth, $f_2$, is apparent from the solid line 75 in FIG. 10. Even additional filtering is provided at frequencies above $f_3$.

Figure 11:
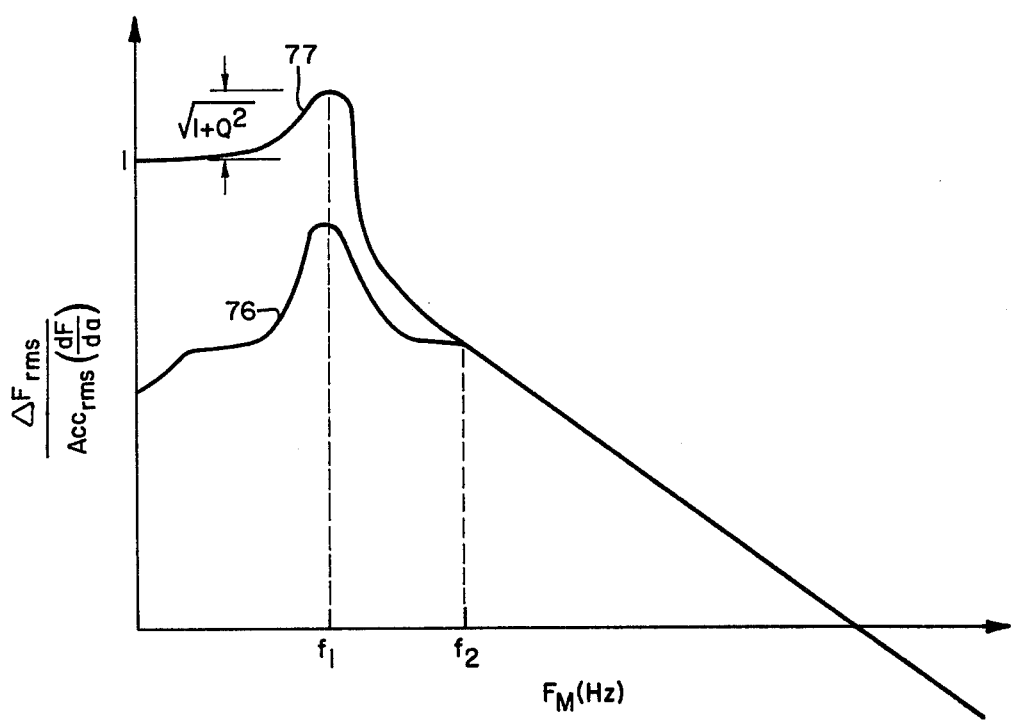
FIG. 11 provides the graphs of the frequency response of an isolated slave oscillator with and without being controlled by a phase lock loop.

FIG. 11 graphically illustrates the amplification response of the mechanical isolator 36 in FIG. 5 with the effects of the phase lock loop 39 thereon using solid line 76. Without the filtering effects of the phase lock loop 39, the vibration noise modulation frequencies would be passed unchecked as shown by the solid line 77 in FIG. 11. It may also be observed in FIG. 11 that if the frequency $f_2$ is selected greater than the mechanical resonant frequency of the passive isolator 36 of FIG. 5 which may be assumed at frequency $f_1$ for the purpose of this embodiment, the low frequency response including the amplification "peaking" due to the mechanical isolator 36 is reduced by the phase lock loop response characteristics, while the high frequency attenuation due to the mechanical isolation 36 remains intact. Thus the desirable high frequency attenuation of vibration noise is realized without the effects of low frequency amplification. It is understood that the actual motion of the slave ascillator 35 of FIG. 5 is unaffected by the loop 39 and it is only the electrical result of the mechanical amplification induced onthe oscillatory signal 40 that is effected by the loop 39.

Figure 12:
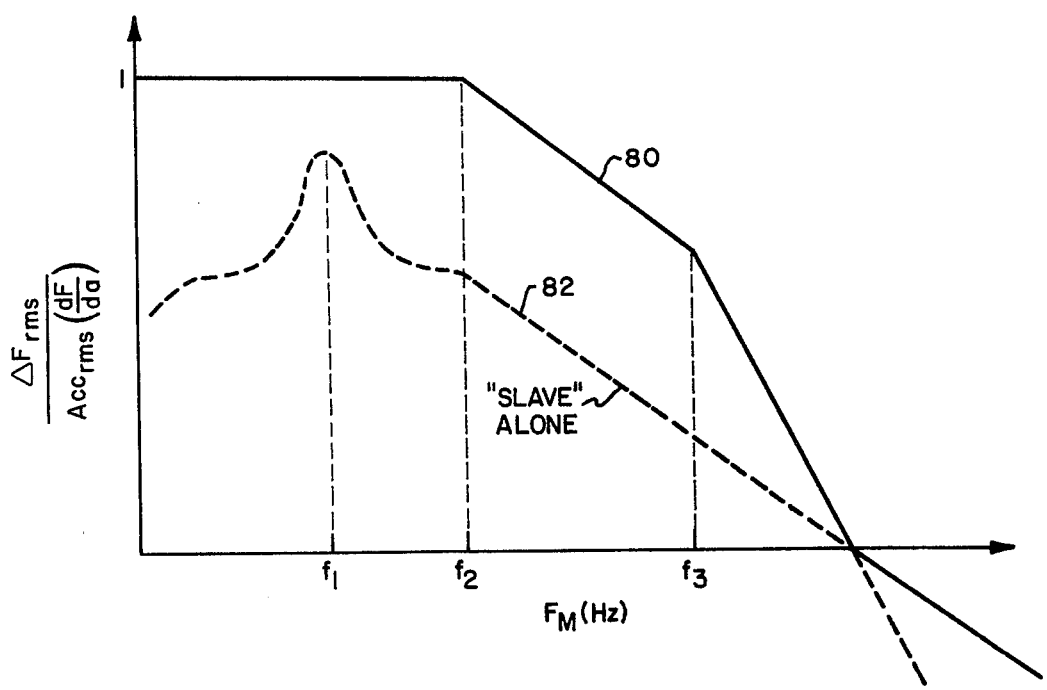
FIG. 12 provides a graph exhibiting the low and high frequency performance of the vibration noise filtering system of FIG. 5.

FIG. 12 illustrates, by the solid line 80, a composite vibration sensitivity of the first oscillator 33, the slave oscillator 35, and the phase lock loop 39. The low frequency performance of the composite below the frequency $f_2$ is primarily the low frequency performance of the first oscillator 33 hard mounted to the mounting surface without the mechanical isolator "peaking". For purposes of comparison, the vibration sensitivity response characteristics of the slave oscillator, mounted as shown in FIG. 5, is provided by the dotted line 82 in FIG. 12. The "peaking" c `he vibration induced noise normally attributable to the passive mechanical isolator 36 of FIG. 5 is not electrically apparent in the oscillatory signal 40 due mainly to the effects of the phase lock loop 39. The high frequency performance of the composite above the frequency $f_3$, primarily includes the desired normal response of the slave oscillator 35 mounted on the mechanical isolator 36 as shown in FIG. 5.

The present invention enables the realization of a vibration noise filter providing both adequate high frequency and low frequency performance which are not readily achievable with existing mechanical techniques, that is without the addition of a hydraulic damping system requiring an additional energy source and equipment for connecting the energy into usable form, the necessity of which is eliminated. Practical design figures which were found suitable for the predetermined frequencies used in this embodiment were $f_1 = 20$ Hz, $f_2 = 100$ Hz and $f_3 = 500$ Hz with a resulting amplification factor, Q, on the order of 3.

We claim:

1. A system for providing a phase stable output oscillatory signal while affected by vibration noise encompassing a wide range frequency spectrum transmitted thereto by a vibration source, said system comprising:
    a first oscillator structurally coupled to the vibration source, for generating a first oscillatory signal having a modulation component being a function of the vibration noise transmitted thereto by the vibration source;
    a second oscillator for generating an output oscillatory signal;
    a vibration isolation system, structurally coupled between the vibration source and the second oscillator, for supporting the second oscillator while reducing the transmissibility of a first range of vibration noise frequencies from the vibration source to the second oscillator, said isolation system also effecting an amplification of vibration noise in a second range of vibration frequencies as transmitted to the second oscillator therethrough;
    means, responsive to the first oscillatory signal, for controlling the second oscillator to render the output oscillatory signal generated thereby phase-locked with the frequency modulated first oscillatory signal, said controlling means being unresponsive in phase-locking the output oscillatory signal to the frequencies of the modulation component of the first oscillatory signal which are greater than a third predetermined frequency range, said first and second range of vibration noise frequencies being substantially within said third predetermined frequency range, whereby vibration induced modulation frequencies greater than the third predetermined frequency range are substantially filtered from the output oscillatory signal.

2. A system in accordance with claim 1 wherein the vibration isolation system is a passive mechanical isolator with a predetermined resonance frequency; wherein further the first range of vibration noise frequencies is that portion of the frequency spectrum of the vibration noise which is greater than the resonance frequency of the isolator; and wherein the passive mechanical isolator additionally has associated therewith an amplification factor, Q, which produces an amplification of the vibration noise transmitted therethrough in the second range of vibration frequencies, said second range of frequencies occurring about the resonant frequency of the isolator in relation to the amplification factor, Q.

3. A system in accordance with claim 2 wherein the controlling means and the second oscillator comprise a phase lock loop being responsive to the first oscillatory signal in accordance with a closed-loop transfer function represented by two poles, said resonant frequencies of the two poles being selected at frequencies greater than the resonant frequency of the mechanical isolator for providing a frequency response pass bandwidth substantially encompassing the second range of vibration noise frequencies; and wherein the frequency response pass bandwidth of the phase lock loop defines the third frequency range.

4. A system in accordance with claim 1 wherein the first oscillator is an electronic quartz crystal oscillator.

5. A system in accordance wih claim 1 wherein the second oscillator is a tunable electronic quartz crystal oscillator; and wherein the frequency of the second oscillatory signal is controlled by varying the series resonance of the crystal configured therein by the controlling means.

6. A system in accordance with claim 5 wherein the controlling means further comprises a doubly-balanced signal frequency mixer having the first and second oscillatory signals as inputs and, in cascade therewith, an amplifier, characterized by a predetermined open loop gain frequency spectrum, for providing a controlling signal to the second oscillator.

7. A Radar Master Oscillator employing a vibration noise filtering system for providing both electrical and mechanical filtering of vibration noise which is transmitted to said radar master oscillator from a mechanically coupled vibration noise source, said vibration noise containing frequencies across a wide range frequency spectrum, said radar master oscillator comprising:
    an oscillator for generating a first electrical oscillatory signal having both a carrier frequency and a modulation frequency spectrum which is caused primarily by said mechanically induced vibration noise;
    an electronic phase lock loop for generating a second electrical oscillatory signal phase-locked with said modulated carrier frequency of said first oscillatory signal, said second electrical oscillatory signal being coupled to the output of said radar master oscillator;
    a passive mechanical isolator, having a predetermined resonant frequency and amplification factor, utilized for mechanically filtering the portion of the vibration source generated noise spectrum containing frequencies greater than the resonant frequency of the isolator from mechanically inducing electrical modulation frequency components in the second oscillatory signal, said mechanical isolator also effecting an amplification of vibration noise within a range of frequencies about its resonant frequency as a result of and as a function of its amplification factor; and
    wherein said phase lock loop has an effective electrical responsiveness only to the portion of the modulation frequency spectrum of the first oscillatory signal which is within a predetermined low frequency pass bandwidth thereof, said pass bandwidth substantially encompassing the amplification range of frequencies of the mechanical isolator.

8. A system in accordance with claim 7 wherein the phase lock loop further comprises:
    a frequency mixer governed by the first and second oscillatory signals to generate a signal representative of the instantaneous phase error between said oscillatory signals;
    an amplifier for amplifying the phase error signal of the mixer in accordance with a predetermined open loop gain modulation frequency response characterization which contributes, in part, to the determination of the closed loop pass bandwidth of the phase lock loop; and
    a crystal oscillator governed by the amplified phase error signal for generating the second oscillatory signal, said crystal oscillator being characterized by an integration function having a predetermined 0 dB crossover frequency in the frequency domain which substantially determines the effective closed loop pass bandwidth of the phase lock loop.

9. A system in accordance with claim 8 wherein the oscillator for generating the first oscillatory signal is directly mounted to a mounting plate which is considered a primary source of vibration noise and the crystal oscillator of the phase lock loop is coupled to the mounting plate using the mechanical isolator disposed therebetween for mechanically filtering the transmissibility of a portion of the vibration noise therethough.

* * * * *